(12) United States Patent
Kim (10) Patent No.: US 9,496,507 B2
(45) Date of Patent: Nov. 15, 2016

(54) EMITTING COMPOUND AND ORGANIC LIGHT EMITTING DIODE DEVICE USING THE SAME

(71) Applicant: LG DISPLAY CO., LTD., Seoul (KR)

(72) Inventor: Young-Ju Kim, Dongducheon (KR)

(73) Assignee: LG Display Co., Ltd., Seoul (KR)

( * ) Notice: Subject to any disclaimer, the term of this patent is extended or adjusted under 35 U.S.C. 154(b) by 456 days.

(21) Appl. No.: 14/084,425

(22) Filed: Nov. 19, 2013

(65) Prior Publication Data

US 2014/0138657 A1 May 22, 2014

(30) Foreign Application Priority Data

Nov. 22, 2012 (KR) ........................ 10-2012-00132888

(51) Int. Cl.
*H01L 51/00* (2006.01)
(52) U.S. Cl.
CPC ....... *H01L 51/0072* (2013.01); *H01L 51/0067* (2013.01)
(58) Field of Classification Search
CPC .................. H01L 51/0067; H01L 51/0072
See application file for complete search history.

(56) References Cited

U.S. PATENT DOCUMENTS

2012/0256173 A1\* 10/2012 Kitamura ............ C07D 209/86 257/40
2012/0280218 A1\* 11/2012 Watanabe ............ C07D 209/82 257/40

(Continued)

FOREIGN PATENT DOCUMENTS

KR 10-2011-0112098 A 10/2011
KR 10-2011-0134201 A 12/2011

*Primary Examiner* — Alexander Kollias
(74) *Attorney, Agent, or Firm* — Birch, Stewart, Kolasch & Birch, LLP (57) ABSTRACT

An embodiment of the present invention provides an emitting compound of following formula:

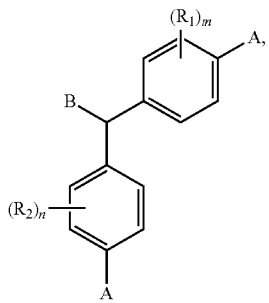

wherein "A" is represented by

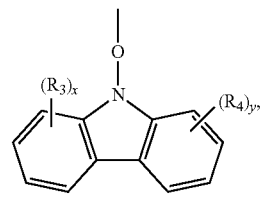

and "B" is represented by

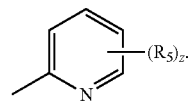

7 Claims, 5 Drawing Sheets

(56) References Cited

U.S. PATENT DOCUMENTS

2012/0292607 A1* 11/2012 Watanabe ............ C07D 209/82 257/40

2012/0298977 A1* 11/2012 Kitamura ................ C07C 15/28 257/40

* cited by examiner

EMITTING COMPOUND AND ORGANIC LIGHT EMITTING DIODE DEVICE USING THE SAME

The present application claims the benefit of Korean Patent Application No. 10-2012-00132888 filed in Korea on Nov. 22, 2012, which is herein incorporated by reference.

BACKGROUND OF THE INVENTION

1. Field of the Invention

The present invention relates to an emitting compound and an organic light emitting diode (OLED) device and more particularly to an emitting compound having excellent power efficiency and hole injecting and transporting properties and an OLED device using the same.

2. Discussion of the Related Art

Recently, requirement for flat panel display devices, such as a liquid crystal display device and a plasma display panel, is increased. However, these flat panel display devices have relatively slow response time and narrow viewing angle in comparison to the cathode ray tube (CRT).

An organic light emitting diode (OLED) device is one of next-generation flat panel display devices being capable of resolving the above problems and occupying small area.

The related art inorganic type OLED device requires a driving voltage higher than 220V, and it is difficult to be a large size because the inorganic type OLED device should be fabricated in a vacuum condition. Particularly, it is very difficult to provide high efficiency blue color images.

To overcome these problems, an organic type OLED device using organic materials is developed. The OLED device is self-emitting type display device. The OLED device emits light by injecting electrons from a cathode as an electron injection electrode and holes from an anode as a hole injection electrode into an emission compound layer, combining the electrons with the holes, generating an exciton, and transiting the exciton from an excited state to a ground state. Elements of the OLED device can be formed on a flexible substrate such as a plastic substrate. In addition, the OLED device has advantages in the viewing angle, the driving voltage, the power consumption and the color purity. Moreover, the OLED device is adequate to produce full-color images.

The emitting principle may be classified into fluorescent emission and phosphorescent emission. In the fluorescent emission, the organic molecule in the singlet exited state is transited to the ground state such that light is emitted. On the other hand, in the phosphorescent emission, the organic molecule in the triplet exited state is transited to the ground state such that light is emitted.

The atoms in the organic material in the OLED device share electron to form covalent bonds. In this process, the atomic orbital is transited into the molecular orbital. In the molecular orbital, the bonding molecular orbital and the antibonding molecular orbital are generated by a pair of orbitals. In this instance, the band formed by the bonding molecular orbitals is referred to as a valence band, and the band formed by the antibonding molecular orbitals is referred to as a conduction band. The valence band having a highest energy level is referred to as a highest occupied molecular orbital (HOMO), and the conduction band having a lowest energy level is referred to as a lowest unoccupied molecular orbital (LUMO). In addition, a difference between the HOMO and the LUMO is referred to as a band-gap.

When the emitting material layer emits light corresponding to an band-gap energy, the singlet exciton having 0 spin and the triplet exciton having 1 spin are generated with a ratio of 1:3. The ground state of the organic material is the singlet state such that the singlet exciton can be transited to the ground state with emitting light. However, since the triplet exciton can not be transited with emitting light, the internal quantum efficiency of the OLED device using the fluorescent material is limited within 25%.

On the other hand, if the spin-orbital coupling momentum is high, the singlet state and the triplet state are mixed such that an inter-system crossing is generated between the singlet state and the triplet state and the triplet exciton also can be transited to the ground state with emitting light. The phosphorescent material can use the triplet exciton as well as the singlet exciton such that the OLED device using the phosphorescent material may have 100% internal quantum efficiency.

Accordingly, the development is focused on the phosphorescent material having higher efficiency than the fluorescent material. Recently, iridium complex, e.g., (bis(2-(2'-benzothienyl)-pyridinato-N,C3')iridium(acetylacetonate)) $(Ir(btp)_2(acac))$ as a red phosphorescent material, bis(2-phenylpyridine) iridium(III) acetylacetonate $((ppy)_2Ir(acac))$ as a green luminescent material, and Iridium (III) bis[2-2',4'-difluorophenylpyridinato-N,C2']picolinate (FIrpic) as a blue phosphorescent material, is introduced. In addition, a blue phosphorescent material, e.g., material, 4,4,N,N-dicarbazole-biphenyl (CBP) and N,N-dicarbazole-3,5-benzene (mCP), as a host is introduced.

However, the blue emitting material has problems in the color purity, the luminescent efficiency and the lifetime resulting from bad thermal stability. As a result, it is not adequate to the OLED for producing high quality blue images, and new blue emitting material is required.

SUMMARY OF THE INVENTION

Accordingly, the present invention is directed to an emitting compound and an OLED device using the same that substantially obviate one or more of the problems due to limitations and disadvantages of the related art.

An object of the present invention is to provide an emitting compound having excellent power efficiency and hole injecting and transporting properties.

Another object of the present invention is to provide an OLED having high brightness and improved emitting efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the present invention provides an emitting compound of following formula:

wherein each of R1 and R2 is independently selected from C1-C60 alkyl group, C2-C60 alkenyl group, C2-C60 alkynyl group, C5-C60 aryl group, C5-C60 heteroaryl group, C5-C40 aryloxy group, C1-C40 alkyloxy group, C1-C40 alkoxycarbonyl group, substituted or non-substituted amino group, halogen, cyano group, nitro group, hydroxyl group and carboxy group, and each of "m" and "n" is an integer of 0 (zero) to 4, wherein "A" is represented by and each of R3 and R4 is independently selected from C1-C20 alkyl group, C2-C20 alkenyl group, C2-C20 alkynyl group, C1-C20 alkoxy group and a benzyl group, wherein each of "x" and "y" is an integer of 0 (zero) to 4, wherein "B" is represented by and R5 is selected from halogen, C1-C60 alkyl group, C2-C60 alkenyl group, C2-C60 alkynyl group, a benzyl group and substituted or non-substituted anthracene, and wherein "z" is an integer of 0 (zero) to 4.

In another aspect of the present invention, the present invention provides an organic light emitting diode device including a first electrode; a second electrode facing the first electrode; and an organic emitting layer between the first and second electrodes and including a compound of following formula:

wherein each of R1 and R2 is independently selected from C1-C60 alkyl group, C2-C60 alkenyl group, C2-C60 alkynyl group, C5-C60 aryl group, C5-C60 heteroaryl group, C5-C40 aryloxy group, C1-C40 alkyloxy group, C1-C40 alkoxycarbonyl group, substituted or non-substituted amino group, halogen, cyano group, nitro group, hydroxyl group and carboxy group, and each of "m" and "n" is an integer of 0 (zero) to 4, wherein "A" is represented by and each of R3 and R4 is independently selected from C1-C20 alkyl group, C2-C20 alkenyl group, C2-C20 alkynyl group, C1-C20 alkoxy group and a benzyl group, wherein each of "x" and "y" is an integer of 0 (zero) to 4, wherein "B" is represented by and R5 is selected from halogen, C1-C60 alkyl group, C2-C60 alkenyl group, C2-C60 alkynyl group, a benzyl group and substituted or non-substituted anthracene, and wherein "z" is an integer of 0 (zero) to 4.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

The present invention provides an emitting compound having improved emitting efficiency and excellent hole transporting property and an OLED device using the emitting compound.

As mentioned above, the related art blue emitting compound has disadvantages in emitting properties and the lifetime. The present invention provides an emitting compound has improved emitting properties and efficiency. The emitting compound of the present invention can be used for a host of an emitting material layer for emitting blue light. In addition, since the emitting compound has an excellent hole injection and transporting property, the compound can be used as a hole injection layer and/or a hole transporting layer.

The emitting compound of the present invention includes three ring substituents, i.e., two carbazoles and one pyridine such that a steric hindrance effect between substituents is maximized. As a result, the emitting compound of the present invention has advantages in the emitting property and the hole injecting and transporting properties.

The emitting compound of the present invention is represented by following Formula 1.

[Formula 1]

In the above Formula 1, each of R1 and R2 is independently selected from C1-C60 alkyl group, C2-C60 alkenyl group, C2-C60 alkynyl group, C5-C60 aryl group, C5-C60 heteroaryl group, C5-C40 aryloxy group, C1-C40 alkyloxy group, C1-C40 alkoxycarbonyl group, substituted or non-substituted amino group, halogen, cyano group, nitro group, hydroxyl group and carboxy group. R1 and R2 is same or different. In the above Formula 1, "m" and "n" respectively mean a number of the substituent, i.e., R1 and R2, for the phenyl ring, and each of "m" and "n" is an integer of 0 (zero) to 4.

In the above Formula 1, "A" is a carbzole derivative represented by

Each of R3 and R4 is independently selected from C1-C20 alkyl group, C2-C20 alkenyl group, C2-C20 alkynyl group, C1-C20 alkoxy group and a benzyl group. In this instance, the benzyl group may be substituted by C1-C20 alkyl. In addition, "x" and "y" respectively mean a number of the substituent, i.e., R3 and R4, for the phenyl ring of carbazole, and each of "x" and "y" is an integer of 0 (zero) to 4.

In the Formula 1, "B" is a pyridine derivative represented by

R5 is selected from halogen, C1-C60 alkyl group, C2-C60 alkenyl group, C2-C60 alkynyl group, a benzyl group and substituted or non-substituted anthracene. In this instance, the benzyl group may be substituted by C1-C60 alkyl. In addition, "z" means a number of the substituent, i.e., R5, for the pyridine ring, and "z" is an integer of 0 (zero) to 4.

For example, each of R1 and R2 is independently selected from an aliphatic group, e.g., C1-C10 alkyl, C2-C20 alkenyl and C2-C20 alkynyl, an aryl group or a heteroaryl group. In this instance, each of the aryl group and the heteroaryl group may have 5-10 atoms forming the ring. In addition, each of "m" and "n" is an integer of 0 (zero) or 1.

R5 is selected from C1-C10 akyl and benzyl substituted by C1-C10 alkyl. Beneficially, R5 is selected from C1-C5 alkyl and benzyl substituted by C1-C5 alkyl. In addition, "z" is an integer of 1.

The emitting compound of the present invention may be one of following Formula 2.

[Formula 2]

Namely, the emitting compound of the present invention includes two phenyl rings, one pyridine ring and two carbazole rings. The two carbazole rings are linked with the two phenyl rings by an ether linkage (—O—). Since the carbazole rings are indirectly linked with the phenyl rings, the steric hindrance effect between the carbazole ring and the phenyl ring is maximized. As a result, the OLED device using the emitting compound has decreased driving voltage and increased lifetime.

The emitting properties of the emitting compound may be controlled by the density of nitrogen atom. Since the emitting compound of the present invention includes one pyridine ring and two carbazole rings, each of which has nitrogen atom, the density of nitrogen atom in the emitting compound is increased such that the emitting compound can emit excellent blue light.

In addition, since the carbazole ring is linked with the phenyl ring by the ether linkage, the emitting compound of the present invention has high thermal stability and excellent hole injecting and transporting property. For example, the emitting compound of the present invention has high glass temperature, e.g., above 175° C., and broad band-gap energy. Accordingly, the emitting compound of the present invention can be used as a host in the emitting material layer instead of CBP or mCP which are widely used as the blue emitting host material. The emitting compound may form the emitting material layer with a dopant or another host. In this instance, the emitting properties and the lifetime of the OLED device using the emitting compound of the present invention are improved.

Moreover, the emitting compound of the present invention includes the carbazole ring having excellent hole injecting and transporting properties. The carbazole ring is linked with the phenyl ring by oxygen atom having excellent electron affinity. As a result, the emitting compound has advantages in electron mobility and electron stability. In addition, the emitting compound has broad band-gap energy, the emitting compound may be used as another layer in an organic emitting layer of the OLED device for transporting the hole and the electron into the emitting material layer. For example, the emitting compound of the present invention can be used the hole injecting layer, the hole transporting layer, the electron transporting layer and the electron injecting layer as well as the emitting material layer.

On the other hand, since the emitting compound of the present invention includes substituents, e.g., alkyl, alkoxy and halogen, the emitting compound has a chemical compatibility and is capable of being dissolved in general organic solvents. For example, due to the akyl substituent for the phenyl ring, the carbazole ring and the pyridine ring, the dissolution and the chemical compatibility with the organic solvents are improved. As a result, the layer of the emitting compound of the present invention has an improved interface property with an electrode of the OLED device.

Furthermore, due to the substituents of the carbazole ring, it is further easier to form a polymer type emitting compound such that a polymer OLED device can be fabricated. In other words, the emitting compound is represented to include monomolecular type carbazole and pyridine. However, the emitting compound can be synthesized as a polymer type using the carbazole. When the emitting compound is used as the polymer OLED device, the emitting efficiency is improved. In addition, since the emitting compound is coated by a printing method, e.g, a spin-coating method, an ink-jet method, a screen printing method and a gravure printing method, instead of a vacuum thermal deposition method for a low molecular material, the fabricating process is simplified and the production costs are reduced. In addition, since the polymer OLED device has sufficient efficiency with the hole transporting layer and the emitting material layer, the polymer OLED has a simple structure and a thin profile.

Figure 1:
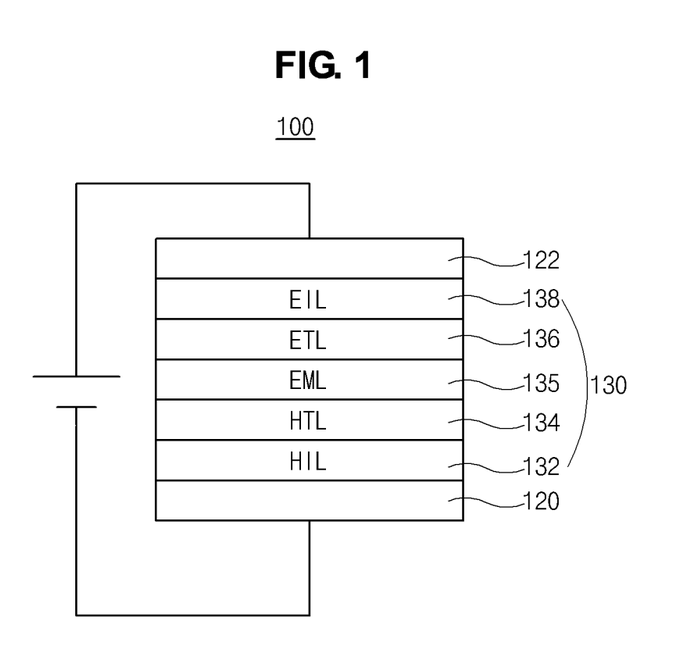
FIG. 1 is a schematic cross-sectional view of an OELD device according to the present invention.

Referring to FIG. 1, which is a schematic cross-sectional view of an OLED device according to the present invention, the OLED includes a transparent substrate (not shown), a first electrode 120 over the transparent substrate, a second electrode 122 over the first electrode 120 and an organic emitting layer 130 between the first and second electrodes 120 and 122.

The first and second electrodes 120 and 122 respectively serve as anode and cathode. The first electrode 120 as the anode is formed of a material having a higher work function than a material of the second electrode 122 as the cathode. The first electrode 120 has properties of efficiently injecting holes as a positive-charged carrier. In addition, the first electrode 120 may be transparent and have good conductivity. The first electrode 120 is formed of metals, mixed metals, metal alloys, mixed metal oxides or conductive polymers. The first electrode 120 may be formed of metal, metal oxide, conductive polymer or ceramic. For example, the first electrode 120 may be formed of one of vanadium, copper, gold, their alloys, indium-tin-oxide (ITO), indium-zinc-oxide (IZO), fluorine-doped tin oxide (FTO), ZnO—$Ga_2O_3$, ZnO—$Al_2O_3$, $SnO_2$—$Sb_2O_3$, polypyrrole, polyaniline, polythiophene, carbon black, and graphene. Beneficially, the first electrode 120 may be formed of ITO.

On the other hand, the second electrode 122 on the organic emitting layer 130 has properties of efficiently injecting electrons as a negative-charged carrier. For example, the second electrode 122 may be formed of one of gold, aluminum (Al), copper, silver, their alloys, Al-calcium alloy, magnesium-silver alloy, Al-lithium alloy, Al-lithiumoxide alloy, rear-earth metals, lanthanide metals, actinide metals. Beneficially, the second electrode 122 may be formed of Al or Al-calcium alloy. A passivation layer (not shown) may be formed on the second electrode 120.

Each of the first and second electrodes 120 and 122 may be formed by a vacuum deposition method. For example, the first electrode 120 may be formed by the vacuum deposition method to have about 5 to 400 μm.

To increase an emitting efficiency, the organic emitting layer 130 may have a multi-layered structure. For example, the organic emitting layer 130 may include a hole injecting layer (HIL) 132, a hole transporting layer (HTL) 134, the emitting material layer (EML) 135, the electron transporting layer (ETL) 136 and the electron injecting layer (EIL) 138. In this instance, the compound of the present invention can be used for at least one of the EML 135 as a host, the HIL 132, the HTL 134, the ETL 136 and the EIL 138.

For example, the EML 135 may be formed of the emitting compound of the present invention by a vacuum deposition method or a solution type coating method. For example, the solution type coating method may be a spin-coating method, a deep-coating method or an ink-jet printing method.

An interfacial property between the first electrode 120 of ITO and the HTL 134 of an organic material is improved by the HIL 132 between the first electrode 120 and the HTL 134. In addition, a surface of the uneven ITO layer is planarized by the HIL 132. The emitting compound of the present invention can be used as the HIL 132. Alternatively, the HIL 132 may be formed of one of aromatic amines, such as copper phthlalocyanine (CuPc), N,N'-dinaphthyl-N,N'-phenyl-(1,1'-biphenyl)-4,4'-diamine, NPD), 4,4',4"-tris[methylphenyl(phenyl)amino] triphenyl amine (m-MTDATA), 4,4',4"-tris[1-naphthyl(phenyl)amino] triphenyl amine (1-TNATA), 4,4',4"-tris[2-naphthyl(phenyl)amino] triphenyl amine (2-TNATA), and 1,3,5-tris[N-(4-diphenylaminophenyl)phenylamino] benzene (p-DPA-TDAB), 4,4'-bis[N-[4-{N,N-bis(3-methylphenyl)amino}phenyl]-N-phenylamino]biphenyl (DNTPD), hexaazatriphenylenehexacarbonitirile (HAT-CN) and poly(3,4-ethylenedioxythiophene)-poly(styrnesulfonate)(PEDOT). The HIL 132 may have a thickness of about 10 to 300 Å.

To securely provide the holes from the first electrode 120 to the EML 135 through the HIL 132, the HTL 134 is formed of a material having highest occupied molecular orbital (HOMO) value higher than the EML 135. The emitting compound of the present invention can be used as the HTL 134. Alternatively, the HTL 134 may be formed of one of a low molecular hole transporting material, e.g., N,N'-bis(3-methylphenyl)-N,N'-diphenyl-[1,1'-diphenyl-4,4'-diamine (TPD), N,N'-bis(1-naphthyl)-N,N'-biphenyl-[1,1'-biphenyl]-4,4'-diamine (TPB), N,N"-bis-(1-naphyl)-N,N"-diphenyl-1,1'-biphenyl-4,4'-diamine (NPB), triphenylamine (TPA), bis[4-(N,N-diethylamino)-2-methylphenyl] (4-methylphenyl)methane (MPMP), N,N,N'-tetrakis(4-methylphenyl)-(1,1'-biphenyl)-4,4-diamine (TTB), and N,N'-bis(4-methylphenyl)-N,N'-bis(4-ethylphenyl)-[1,1'-(3,3'-dimethyl)biphenyl]-4,4'-diamine (E TPD), and a high molecular hole transporting material, e.g., polyvinylcarbazole, polyaniline and (polymethyl)polysilane. For example, the HTL 134 may be formed of NPB and have a thickness of about 10 to 100 nm.

The EML 135 on the HTL includes the emitting compound of the present invention. For example, the emitting compound of the present invention may be used as a host in the EML 135. In this instance, a dopant, e.g., FIrpic, may be doped with a weight % of about 10 to 30 of the EML 135. The EML 135 has a thickness of about 5 to 200 nm, beneficially 50 to 100 nm.

On the other hand, when the emitting compound of the present invention is used for other layer, e.g., the HTL 134, the EML 135 is formed of to include another emitting material as a host. For example, CBP or mCP may be used as the host.

The EIL 138 and ETL 136 are formed between the EML 135 and the second electrode 122. The emitting compound of the present invention can be used as the EIL 138. Alternatively, the EIL 138 may be formed of one of LiF, $BaF_2$ and CsF.

In addition, the ETL 136 is formed of a material having a relatively high electron mobility. The emitting compound of the present invention is used for the ETL 136. Alternatively, the ETL 136 may be formed of one of tris(8-hydroxyquinolinato)aluminum (Alq3), 9-dimethyl-4,7-diphenyl-1,10-phenanthroline (DDPA), 2-(4-biphenyl)-5-(4-tert-butyl)-1,3,4-oxadizole (PBD), 3-(4-biphenyl)-4-phenyl-5-(4-tert-butyl)-1,2,4-triazole (TAZ) and phenylquinozaline. The ETL 136 may have a thickness of about 5 to 150 nm.

Although not shown, a hole blocking layer (HBL) of a material having a relatively low HOMO level may be formed between the EML 135 and the ETL 136 to prevent reducing the lifetime and the emitting efficiency by the holes to the second electrode 122. For example, the HBL may be formed of one of 2,9-dimethyl-4,7-diphenyl-1,10-phenanthroline (BCP) and have a thickness of about 5 to 150 nm.

Hereinafter, synthesis of the emitting compound of the present invention is explained. However, the synthesis of the emitting compound of the present invention is not limited thereto.

1. Synthesis of

(Compound 7)

1) Compound 1

4-bromophenol

[Reaction Formula 1]

1

4-bromophenol (1 eq) was dissolved in THF solvent (20 L). In −78° C., n-BuLi (1.5 eq) was added and stirred. In a low temperature condition, 9 methoxy-9-H-carbazole (1.5 eq) was gradually added and refluxed for 12 hrs. The solution was further stirred with gradually increasing the temperature and extracted using methylenechloride solvent (20 ml). The compound 1 was obtained by chromatography.

2) Compound 3

[Reaction Formula 2]

Picolinic acid (R═H, compound 2, 25 g) was dissolved in benzene (200 ml). SOCl$_2$ (10 ml) was added at 0° C., and the solution was refluxed for 12 hrs. The resulting solution was extracted using methylenechloride to obtain picolinoyl acid (the compound 3). (6.7 g, yield: 60%)

3) Compound 4

[Reaction Formula 3]

The compound 3 was dissolved in methylenechloride (20 ml) under Ar gas condition, and acetophenone (18 ml) was injected at 0° C. Then, the solution was stirred for 3 hrs under the room temperature. The resulting solution was extracted using water and methylenechloride, and water (or moisture) was removed using Na$_2$SO$_4$. The compound 4 was obtained using methylenechloride/hexane solvent. (yield: 50%).

4) Compound 5a

[Reaction Formula 4]

The compound 4 (10 g) with AlCl$_3$ (21 g) was stirred for 4 hrs under a temperature of 160° C. The resultant was extracted using 3N HCl and methylenechloride (200 ml), and moisture was removed using Na$_2$SO$_4$. The isomer compounds 5a and 5b are obtained by chromatography column using hexane and ethylacetate (7:3).

5) Compound 6

[Reaction Formula 5]

The compound 5a was dissolved in methanol (30 ml). NaBH$_4$ (2.5 g) was added at 0° C. and stirred for 3 hrs under the room temperature. The solution was neutralized by AcOH (50 ml), and MeOH was removed. The compound 6 was obtained using H$_2$O (30 ml) and methylenechloride (150 ml).

6) Compound 7

[Reaction Formula 6]

Figure 2:
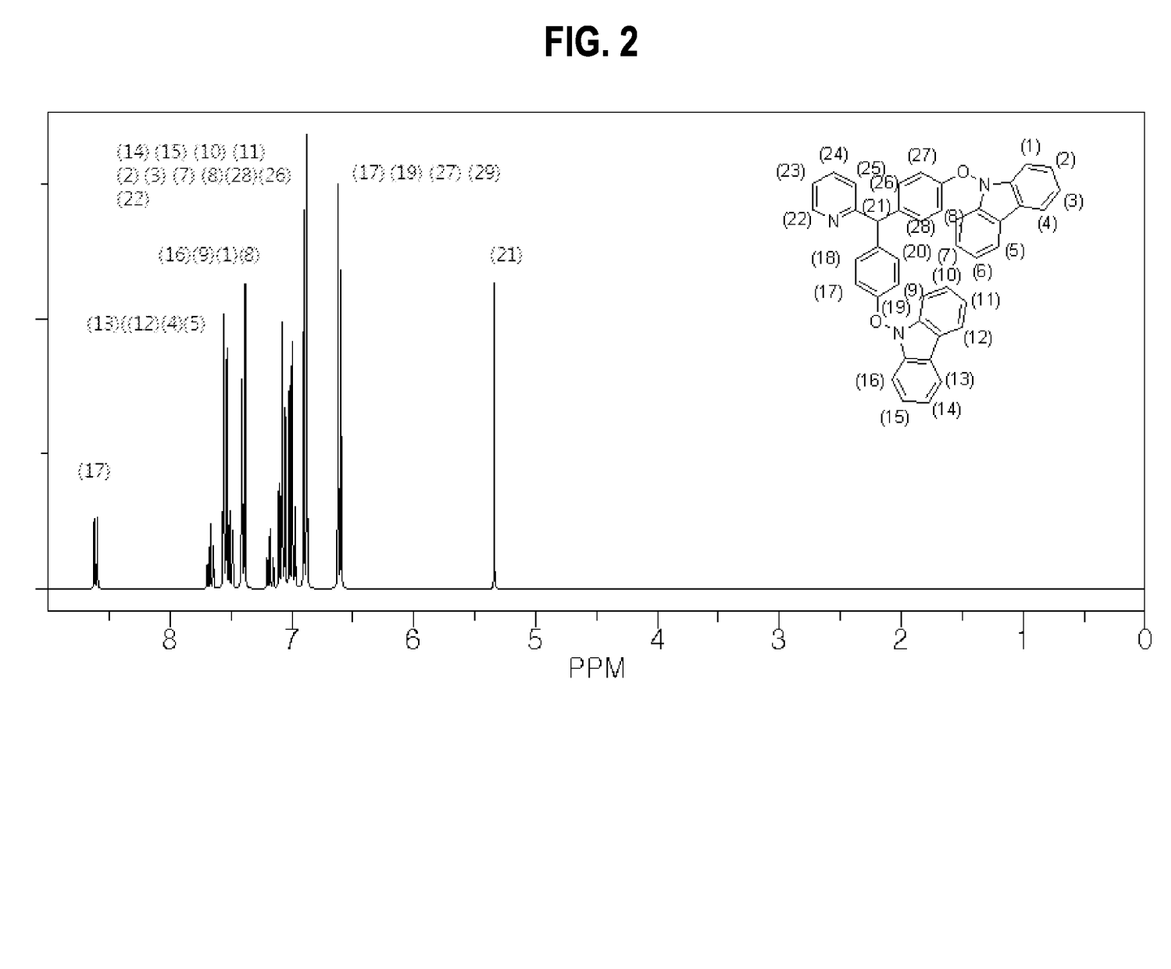
FIGS. 2 to 4 are graphs showing NMR spectrums of an emitting compound according to embodiments the present invention.

The compound 6 (4-hyroxyphenyl)(pyridine-2-yl)methanol) and the compound 1 was mixed with a ratio of 1:2. $H_3PO_4$ solution (85%, 20 ml) was gradually injected at 0° C. Solvent was injected and stirred for 2 hrs with increasing the temperature to the room temperature. The solution was heated for 2 hrs under 200° C. and cooled to 15° C. The solution was neutralized using NaOH solution (30%, 20 ml) and re-crystallized using ethylacetate to obtain the compound 7. The NMR spectrum of the compound 7 is shown in FIG. 2.

2. Synthesis of (Compound 8)

Figure 3:
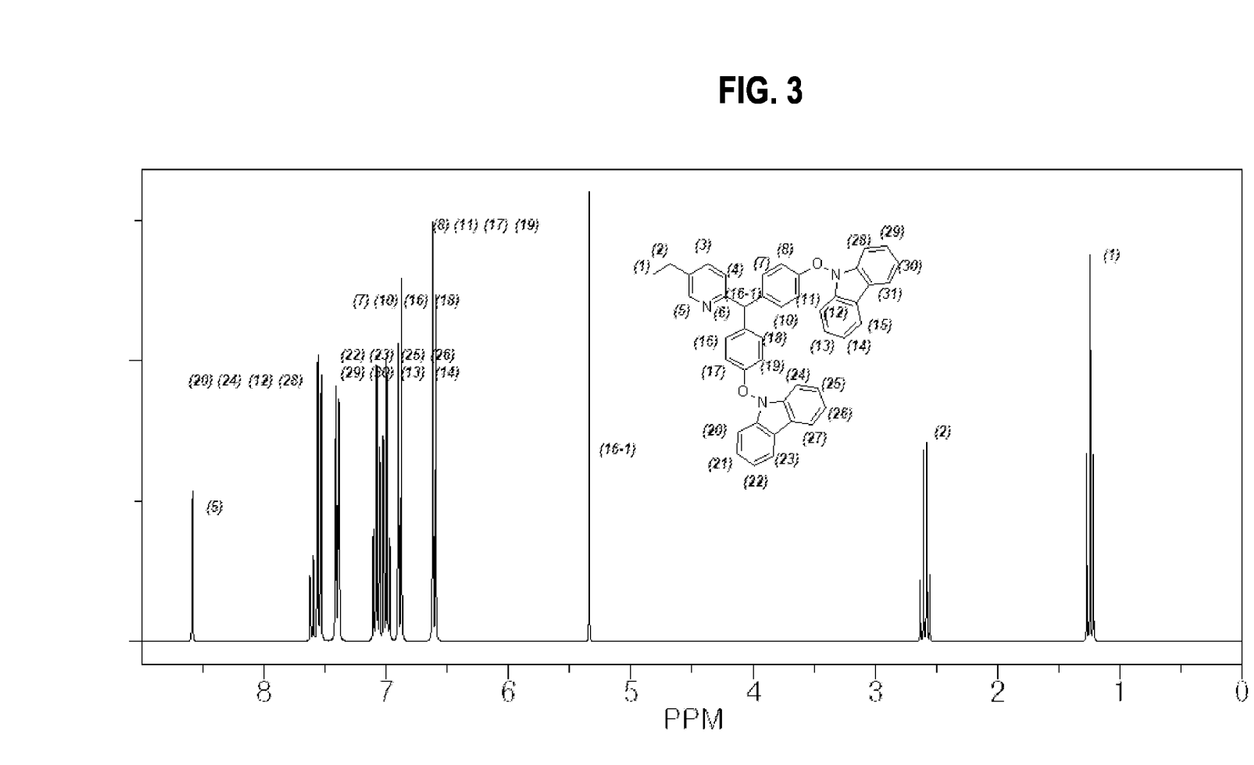

The compound 8 was obtained by the above synthesis with R=ethyl. The NMR spectrum of the compound 8 is shown in FIG. 3.

3. Synthesis of (compound 9)

Figure 4:
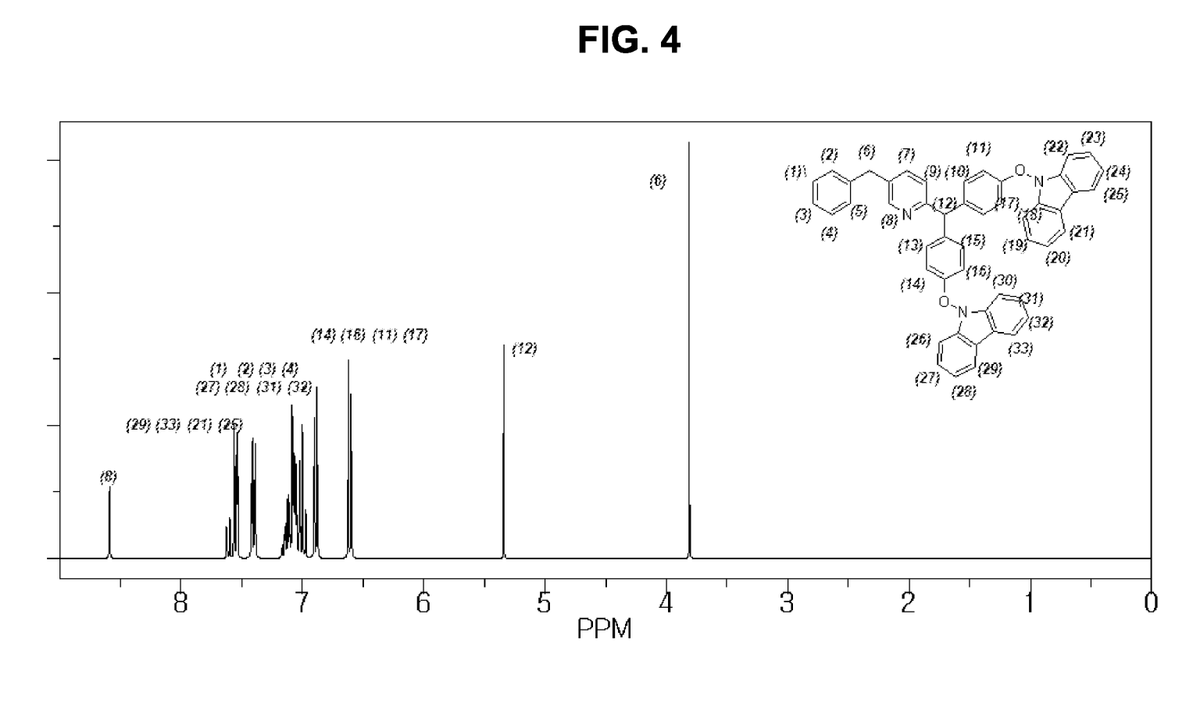

The compound 9 was obtained by the above synthesis with R=ethylbenzene. The NMR spectrum of the compound 9 is shown in FIG. 4.

Example 1

Emitting Diode with the Compound 7

An ITO plate (2 cm*2 cm, sheet resistance=30Ω, thickness=1.08 mm, light transmittance=80%) is prepared, and a portion of the ITO plate is removed using an etchant. The ITO plate is washed in the ultrasonic cleaner using in an order of MeOH, acetone and isopropylalcohol (IPA) for 15 minutes to each cleaning solution and further washed using ionic-water. Then, the ITO plate is dried by annealing under 230° C. for 30 minutes. The compound 1 is dissolved in tetrachloroethane solvent, and the solution is coated on the ITO plate. An aluminum (Al) electrode is formed on the layer of the compound 7 by a thermal deposition process in a vacuum deposition apparatus such that an emitting diode (ITO/compound 7/Al) is fabricated. By applying voltages to the ITO plate and the Al electrode, the properties of the emitting diode using the compound 7 are tested.

Example 2

Emitting Diode with the Compound 8

By applying voltages to the ITO plate and the Al electrode, the properties of the emitting diode using the compound 8, which is fabricated by process in the Example 1 with the compound 8 instead of the compound 7, are tested.

Example 3

Emitting Diode with the Compound 9

By applying voltages to the ITO plate and the Al electrode, the properties of the emitting diode using the compound 9, which is fabricated by process in the Example 1 with the compound 8 instead of the compound 7, are tested.

Comparative Example 1

Emitting Diode with CBP

By applying voltages to the ITO plate and the Al electrode, the properties of the emitting diode using CBP, which is fabricated by process in the Example 1 with CBP instead of the compound 7, are tested.

Figure 5:
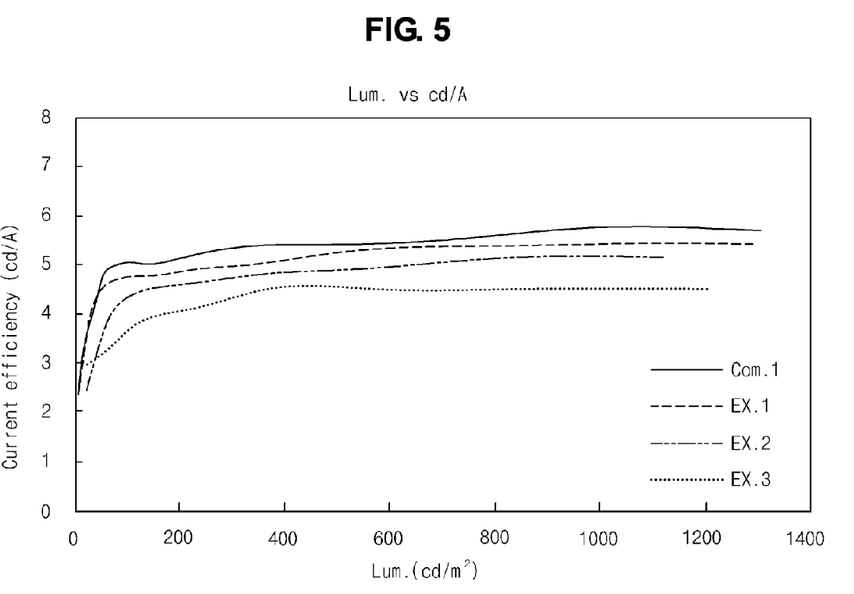
FIG. 5 is I-V-L graphs of an emitting diode according to the present invention.

The tested properties of Examples 1 to 3 and Comparative Example 1 are listed in Table 1, and I-V-L graphs in the emitting diode of Examples 1 to 3 and Comparative Example 1 are shown in FIG. 5.

TABLE 1

| | | Current density [mA/cm$^2$] | Driving voltage [V] | Emitting efficiency [cd/A] |
|---|---|---|---|---|
| Ex. 1 | Compound 7 | 10 | 5.2 | 5.4 |
| Ex. 2 | Compound 8 | 10 | 5.1 | 5.1 |
| Ex. 3 | Compound 9 | 10 | 4.8 | 5.7 |
| Com. 1 | CBP | 10 | 6.3 | 4.5 |

Example 4

Emitting Diode with the Compound 7 and FIrpic

By applying voltages to the ITO plate and the Al electrode, the properties of the emitting diode using the compound 9, which is fabricated by process in the Example 1 with FIrpic (compound 7:FIrpic=90:10), are tested. (ITO/(compound 7:FIrpic)/Al)

Example 5

Emitting Diode with the Compound 8 and FIrpic

By applying voltages to the ITO plate and the Al electrode, the properties of the emitting diode using the compound 8, which is fabricated by process in the Example 1 with FIrpic (compound 8:FIrpic=90:10), are tested. (ITO/(compound 8:FIrpic)/Al)

Example 6

Emitting Diode with the Compound 9 and FIrpic

By applying voltages to the ITO plate and the Al electrode, the properties of the emitting diode using the compound 9, which is fabricated by process in the Example 1 with FIrpic (compound 9:FIrpic=90:10), are tested. (ITO/(compound 9:FIrpic)/Al)

Comparative Example 2

Emitting Diode with CBP and FIrpic

By applying voltages to the ITO plate and the Al electrode, the properties of the emitting diode using CBP, which is fabricated by process in the Example 1 with FIrpic (CBP:FIrpic=90:10), are tested. (ITO/(CBP:FIrpic)/Al)

The tested properties of Examples 4 to 6 and Comparative Example 2 are listed in Table 2.

TABLE 2

| | | Current density [mA/cm$^2$] | Driving voltage [V] | current efficiency [cd/A] |
|---|---|---|---|---|
| Ex. 4 | Compound 7: FIrpic | 10 | 4.8 | 5.7 |
| Ex. 5 | Compound 8: FIrpic | 10 | 4.6 | 5.5 |
| Ex. 6 | Compound 9: FIrpic | 10 | 4.4 | 5.8 |
| Com. 2 | CBP: FIrpic | 10 | 5.3 | 5.2 |

Referring to Table 1, Table 2 and FIG. 5, the emitting diode using the emitting compound of the present invention has advantages in the emitting efficiency and the driving voltage in comparison to the emitting diode using CBP. As a result, the OLED device (or the emitting diode) using the emitting compound of the present invention can provide high quality images without thermal degradation and with improved lifetime.

Figure 6:
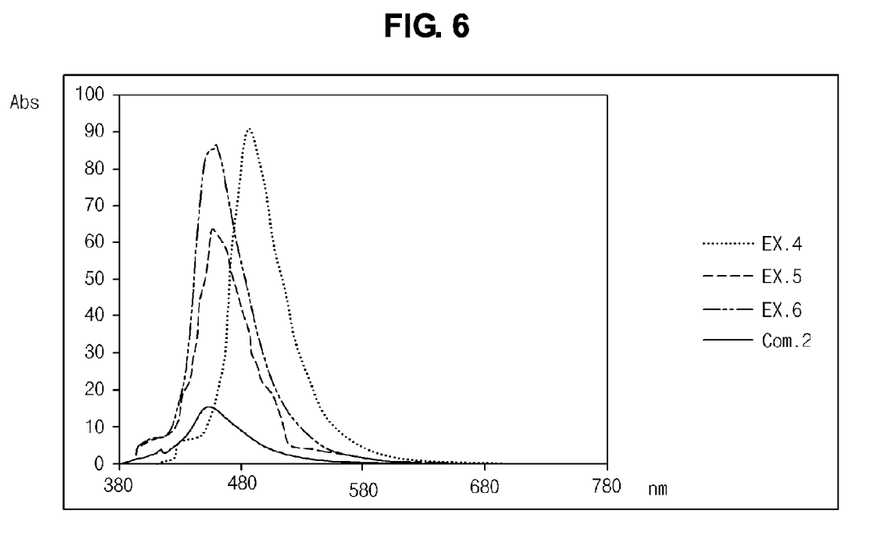
FIG. 6 is a graph showing PL spectrums of an emitting diode according to the present invention.

PL (photoluminescence) spectrums in the emitting diode of Examples 4 to 6 and Comparative Example 2 are shown in FIG. 6. As shown in FIG. 6, the emitting compound of the present invention has a main peak in a blue wave region and has advantages in brightness in comparison to the related art compound CBP.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:
1. An emitting compound of following formula:

wherein each of $R_1$ and $R_2$ is independently selected from the group consisting of $C_1$-$C_{60}$ alkyl group, $C_2$-$C_{60}$ alkenyl group, $C_2$-$C_{60}$ alkynyl group, $C_5$-$C_{60}$ aryl group, $C_5$-$C_{60}$ heteroaryl group, $C_5$-$C_{40}$ aryloxy group, $C_1$-$C_{40}$ alkyloxy group, $C_1$-$C_{40}$ alkoxycarbonyl group, substituted amino group, non-substituted amino group, halogen, cyano group, nitro group, hydroxyl group and carboxy group, and each of m and n is an integer of 0 to 4, wherein A is represented by and each of $R_3$ and $R_4$ is independently selected from the group consisting of $C_1$-$C_{20}$ alkyl group, $C_2$-$C_{20}$ alkenyl group, $C_2$-$C_{20}$ alkynyl group, $C_1$-$C_{20}$ alkoxy group and a benzyl group, wherein each of x and y is an integer of 0 to 4, wherein B is represented by and $R_5$ is selected from the group consisting of halogen, $C_1$-$C_{60}$ alkyl group, $C_2$-$C_{60}$ alkenyl group, $C_2$-$C_{60}$ alkynyl group, a benzyl group, substituted anthracene, and non-substituted anthracene, and wherein z is an integer of 0 to 4.

2. The compound according to claim 1, wherein the $R_5$ is $C_1$-$C_{10}$ alkyl or benzene substituted by $C_1$-$C_{10}$ alkyl, and the z is 1.

3. The compound according to claim 1, wherein the compound is one of the following:

,

, or

4. An organic light emitting diode device, comprising:
a first electrode;
a second electrode facing the first electrode; and
an organic emitting layer between the first and second electrodes and including a compound of following formula:

wherein each of $R_1$ and $R_2$ is independently selected from the group consisting of $C_1$-$C_{60}$ alkyl group, $C_2$-$C_{60}$ alkenyl group, $C_2$-$C_{60}$ alkynyl group, $C_5$-$C_{60}$ aryl group, $C_5$-$C_{60}$ heteroaryl group, $C_5$-$C_{40}$ aryloxy group, $C_1$-$C_{40}$ alkyloxy group, $C_1$-$C_{40}$ alkoxycarbonyl group, substituted amino group, non-substituted amino group, halogen, cyano group, nitro group, hydroxyl group and carboxy group, and each of m and n is an integer of 0 to 4, wherein A is represented by and each of $R_3$ and $R_4$ is independently selected from the group consisting of $C_1$-$C_{20}$ alkyl group, $C_2$-$C_{20}$ alkenyl group, $C_2$-$C_{20}$ alkynyl group, $C_1$-$C_{20}$ alkoxy group and a benzyl group, wherein each of x and y is an integer of 0 to 4, wherein B is represented by and R$_5$ is selected from the group consisting of halogen, C$_1$-C$_{60}$ alkyl group, C$_2$-C$_{60}$ alkenyl group, C$_2$-C$_{20}$ alkynyl group, a benzyl group, substituted anthracene and non-substituted anthracene, and wherein z is an integer of 0 to 4.

5. The organic light emitting diode device according to claim 4, wherein the R$_5$ is C$_1$-C$_{10}$ alkyl or benzene substituted by C$_1$-C$_{10}$ alkyl, and the z is 1.

6. The organic light emitting diode device according to claim 4, wherein the compound is one of the following:

, or

7. The organic light emitting diode device according to claim 4, wherein the organic emitting layer includes a hole injecting layer, a hole transporting layer, an emitting material layer, an electron transporting layer and an electron injecting layer, and the compound is used as a material of at least one of the hole injecting layer, the hole transporting layer, the emitting material layer, the electron transporting layer or the electron injecting layer.

* * * * *